(12) United States Patent
Ninomiya et al.

(10) Patent No.: US 8,405,076 B2
(45) Date of Patent: Mar. 26, 2013

(54) NONVOLATILE MEMORY ELEMENT

(75) Inventors: Takeki Ninomiya, Osaka (JP); Takeshi Takagi, Kyoto (JP); Zhiqiang Wei, Osaka (JP)

(73) Assignee: Panasonic Corporation, Osaka (JP)

( * ) Notice: Subject to any disclaimer, the term of this patent is extended or adjusted under 35 U.S.C. 154(b) by 157 days.

(21) Appl. No.: 12/920,154

(22) PCT Filed: Feb. 3, 2010

(86) PCT No.: PCT/JP2010/000624
§ 371 (c)(1),
(2), (4) Date: Aug. 30, 2010

(87) PCT Pub. No.: WO2010/090002
PCT Pub. Date: Aug. 12, 2010

(65) Prior Publication Data
US 2011/0001109 A1    Jan. 6, 2011

(30) Foreign Application Priority Data

Feb. 4, 2009  (JP) .................................. 2009-023449

(51) Int. Cl.
*H01L 29/12*  (2006.01)
(52) U.S. Cl. ........ 257/43; 257/2; 257/E45.002; 257/E45.003; 365/46; 365/100
(58) Field of Classification Search .................. None
See application file for complete search history.

(56) References Cited

U.S. PATENT DOCUMENTS

| | | | |
|---|---|---|---|
| 2004/0245557 A1 | 12/2004 | Seo et al. | |
| 2007/0114587 A1 | 5/2007 | Seo et al. | |
| 2007/0267675 A1 | 11/2007 | Cho et al. | |
| 2008/0002458 A1 | 1/2008 | Bae et al. | |
| 2008/0062557 A1* | 3/2008 | Tsuchiya et al. | 360/86 |
| 2008/0083918 A1 | 4/2008 | Aratani et al. | |
| 2009/0072212 A1 | 3/2009 | Van De Sluis et al. | |
| 2009/0121823 A1 | 5/2009 | Kawano et al. | |
| 2009/0218565 A1 | 9/2009 | Kawano et al. | |
| 2009/0283736 A1 | 11/2009 | Kanzawa et al. | |
| 2009/0317958 A1* | 12/2009 | Tang et al. | 438/384 |
| 2009/0321709 A1 | 12/2009 | Muraoka et al. | |
| 2010/0102289 A1* | 4/2010 | Dimitrov et al. | 257/2 |

FOREIGN PATENT DOCUMENTS

| | | |
|---|---|---|
| JP | 2004-363604 | 12/2004 |
| JP | 2006-040946 | 2/2006 |
| JP | 2007-311798 | 11/2007 |
| JP | 2007-335869 | 12/2007 |
| JP | 2008/098537 | 4/2008 |
| JP | 2008-543040 | 11/2008 |
| WO | 2006/126110 | 11/2006 |
| WO | 2008/023637 | 2/2008 |

(Continued)

*Primary Examiner* — Fei Fei Yeung Lopez
(74) *Attorney, Agent, or Firm* — Wenderoth, Lind & Ponack, L.L.P.

(57) ABSTRACT

A nonvolatile memory element (100) includes a variable resistance layer (107) including a first metal oxide $MO_x$ and a second metal oxide $MO_y$, and reaction energy of chemical reaction related to the first metal oxide, the second metal oxide, oxygen ions, and electrons is 2 eV or less. The chemical reaction is expressed by a formula 13, where a combination ($MO_x$, $MO_y$) of $MO_x$ and $MO_y$ is selected from a group including ($Cr_2O_3$, $CrO_3$), ($Co_3O_4$, $Co_2O_3$), ($Mn_3O_4$, $Mn_2O_3$), ($VO_2$, $V_2O_5$), ($Ce_2O_3$, $CeO_2$), ($W_3O_8$, $WO_3$), ($Cu_2O$, $CuO$), ($SnO$, $SnO_2$), ($NbO_2$, $Nb_2O_5$), and ($Ti_2O_3$, $TiO_2$).

[Mathematical Expression 13]

$$MO_x + (y-x)O^{2-} \Leftrightarrow MO_y + 2(y-x)e^-  \quad \text{(Formula 13)}$$

5 Claims, 11 Drawing Sheets

FOREIGN PATENT DOCUMENTS

| | | |
|---|---|---|
| WO | 2008/038365 | 4/2008 |
| WO | 2008/149484 | 12/2008 |
| WO | 2008/153099 | 12/2008 |

\* cited by examiner

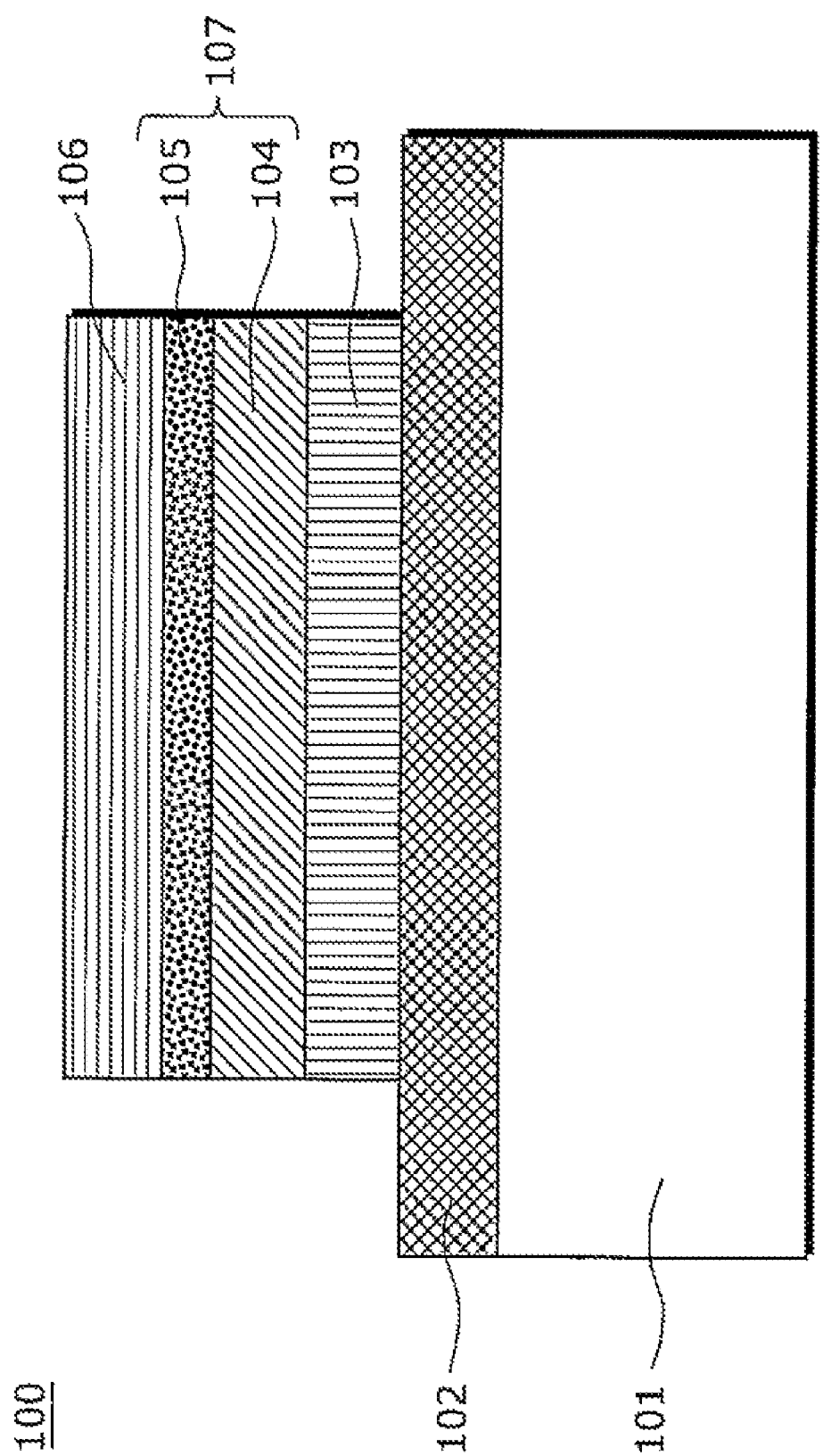

Initial State

Low Resistance State

High Resistance State

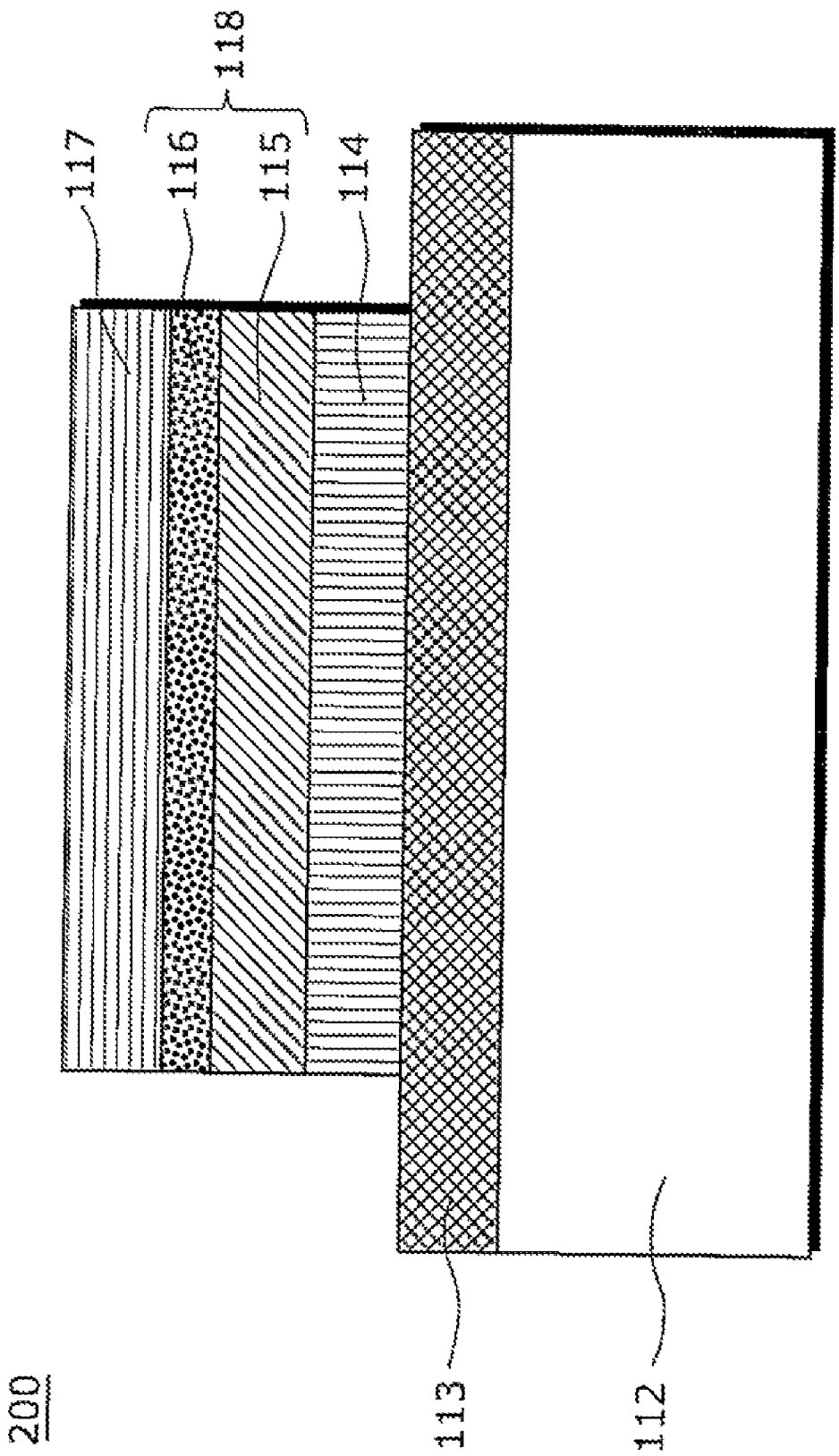

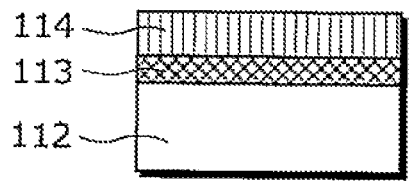
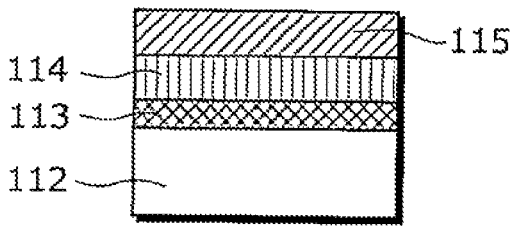
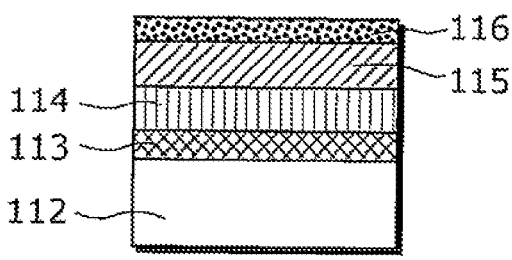
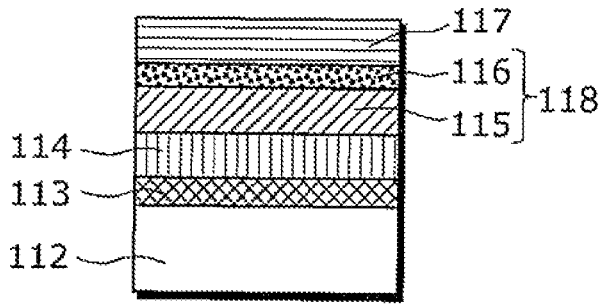
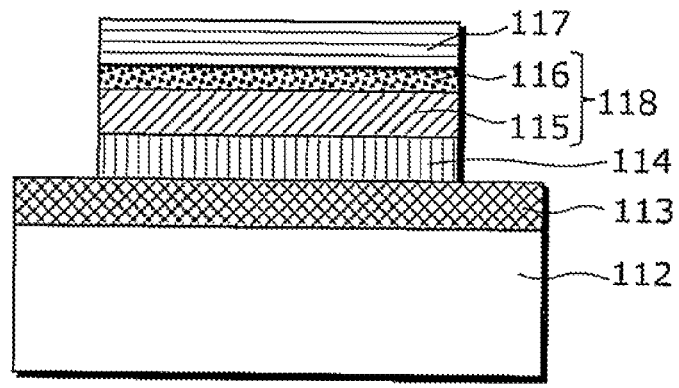

Initial State

Low Resistance State

High Resistance State

NONVOLATILE MEMORY ELEMENT

TECHNICAL FIELD

The present invention relates to nonvolatile memory elements, and more particularly to a resistance-variable nonvolatile memory element having resistance values that vary depending on applied electric signals.

BACKGROUND ART

In recent years, with the development of digital technologies, electronic devices such as mobile information devices and information home appliances have been developed to have much more advanced functions. Demands therefore arise for a larger capacity of nonvolatile memory elements, reduction of power consumption for writing, a higher speed for a writing/reading time, and a longer duration.

It is said that attempt at more micro-fabricated flash memories using existing floating gates has a limit to satisfy such demands. On the other hand, in the case of a nonvolatile memory element (resistance-variable memory) in which a variable resistance layer is used as a material of a memory part, the memory element has a simple structure including the variable resistance elements. Such a nonvolatile memory element is expected to offer further micro-fabrication, a higher speed, and lower power consumption.

The use of a variable resistance layer as a material of a memory part allows a resistance value of the variable resistance layer to change from high resistance to low resistance or from low resistance to high resistance depending on applied electric pulses, for example. Here, it is necessary to clearly distinguish two values of the low and high resistance from each other, and to achieve stable, high-speed change between the low and high resistance to memorize the two values as a nonvolatile memory. Various techniques have conventionally been disclosed to achieve stability of such memory characteristics and to micro-fabricate the memory elements.

One of the conventional techniques is disclosed in Patent Reference 1 to provide a memory element that is a variable resistance element serving as a memory cell. The variable resistance element includes two electrodes and a memory layer sandwiched by the two electrodes. With the structure, a resistance value of the memory layer can be reversibly changed. FIG. 11 is a cross-sectional view of a structure of the conventional memory element.

As shown in FIG. 11, the memory elements are a plurality of variable resistance elements 10 arranged in an array to serve as memory cells. In each of the variable resistance element 10, a high resistance layer 2 and an ion source layer 3 are sandwiched by a lower electrode 1 and an upper electrode 4. The set of the high resistance layer 2 and the ion source layer 3 forms a memory layer into which data to be recorded onto the variable resistance element 10 of each memory cell is written.

Each of the variable resistance elements 10 is arranged above a corresponding one of MOS transistors 18 formed on a semiconductor substrate 11. Each of the MOS transistors 18 includes source/drain regions 13 and gate electrodes 14, which are formed in a region separated from other regions by element separating layers 12 in the semiconductor layer 11. The gate electrode 14 serves also as a word line that is one of address lines of the memory element.

One of the source/drain regions 13 in the MOS transistor 18 is electrically connected to the lower electrode 1 of the variable resistance element 10 via a plug layer 15, a metal line layer 16, and a plug layer 17. The other source/drain region 13 of the MOS transistor 18 is connected to the metal line layer 16 via the plug layer 15. The metal line layer 16 is connected to a bit line that is the other one of the address lines of the memory element.

Different voltages are applied between the lower electrode 1 and the upper electrode 4, respectively, to cause potentials having different polarities. Thereby, an ion source in the ion source layer 3 is moved to the high resistance layer 2. Or, the ion source is moved from the high resistance layer 2 to the upper electrode 4. With the structure, a resistance value of the variable resistance element 10 is changed from a high resistance state to a low resistance state or from a low resistance state to a high resistance state, in order to memorize data into the variable resistance element 10.

There is another disclosure of an example of a memory element made of a material (variable resistance material) different from that disclosed in Patent Reference 1. In the disclosure, a transition metal oxide made of two elements is used. For example, Patent Reference 2 discloses NiO, $V_2O_5$, ZnO, $Nb_2O_5$, $TiO_2$, $WO_3$, and CoO for variable change materials.

PRIOR ARTS

Patent References
Patent Reference 1: Japanese Unexamined Patent Application Publication No. 2006-40946
Patent Reference 2: Japanese Unexamined Patent Application Publication No. 2004-363604

SUMMARY OF THE INVENTION

Problems that Invention is to Solve

However, the above-described variable resistance material has the following problem. First, if a transition metal oxide such as NiO is used as variable resistance material, in order to change the variable resistance material from a low resistance state to a high resistance state it is necessary to recover a filamentary electric path formed in NiO by applying a long pulse of μs order to generate Joule heat. If a nonvolatile memory element is used as a memory, it is assumed that the nonvolatile memory elements are integrated with high density under a fine design rule. However, there is a possibility that the generated Joule heat triggers errors of the nonvolatile memory elements. Therefore, the above-described technology does not suite for high micro-fabrication.

In addition, when the nonvolatile memory element using variable resistance material is operated as a memory, a value of an applied voltage is required to be decreased as much as possible in terms of power consumption. More specifically, an absolute value of the applied pulse voltage is desirably 2 V or less. This is because, if the nonvolatile memory elements are combined with an existing CMOS to be used, in MOS transistors, which are used in circuits operating at high speed and with low power consumption, a maximum voltage applicable to the nonvolatile memory element has a maximum value of approximately 2 V.

Except the above-described variable resistance material, other various oxides are still examined for existence of occurrence of variable resistance operation. However, from a principle viewpoint of variable resistance operation, no technique of designing a nonvolatile memory element capable of operating with low voltages has yet been disclosed.

In order to address the above problems, an object of the present invention is to provide a nonvolatile memory element that does not need to generate Joule heat in resistance variation operations, and that can perform variable resistance operations with a low voltage.

Means to Solve the Problems

In accordance with an aspect of the present invention for achieving the object, there is provided a nonvolatile memory element including: a substrate; a lower electrode layer formed on the substrate; a variable resistance layer formed on the lower electrode layer, the variable resistance layer changing between a high resistance state and a low resistance state depending on applied electric signals; and an upper electrode layer formed on the variable resistance layer, wherein the variable resistance layer has a multiple-layered structure including at least two layers of: a first metal oxide layer including a first metal oxide having a first resistivity; and a second metal oxide layer including a second metal oxide having a second resistivity, the second metal oxide including a same metal element as a metal element of the first metal oxide, the second metal oxide layer contacts at least one of the upper electrode layer and the lower electrode layer, the first resistivity is lower than the second resistivity, and an absolute value of reaction energy of chemical reaction related to the first metal oxide, the second metal oxide, oxygen ions, and electrons is equal to or less than 2 eV.

The chemical reaction is expressed by a formula 1:
[Mathematical Expression 1]

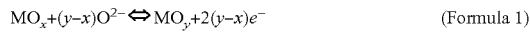

$$MO_x + (y-x)O^{2-} \Leftrightarrow MO_y + 2(y-x)e^-$$ (Formula 1)

wherein x and y represent arbitrary positive numbers satisfying x<y, $MO_x$ represents a composition of the first metal oxide, and $MO_y$ represents a composition of the second metal oxide, and a combination ($MO_x$, $MO_y$) of $MO_x$ and $MO_y$ is selected from a group including ($Cr_2O_3$, $CrO_3$), ($Co_3O_4$, $Co_2O_3$), ($Mn_3O_4$, $Mn_2O_3$), ($VO_2$, $V_2O_5$), ($Ce_2O_3$, $CeO_2$), ($W_3O_8$, $WO_3$), ($Cu_2O$, $CuO$), ($SnO$, $SnO_2$), ($NbO_2$, $Nb_2O_5$), and ($Ti_2O_3$, $TiO_2$).

Thereby, it is possible to suppress the applied voltage to be 2 V or less in variable resistance operations. As a result, the variable resistance operations can be performed with a low voltage. In addition, the suppression of the applied voltage up to be 2 V or less makes it possible to combine the nonvolatile memory element with an existing MOS transistor which are also used with peripheral circuits, so as to perform variable resistance operations.

Moreover, the variable resistance operation is performed using reversible oxidation-reduction reaction. It is therefore not necessary to recover a filamentary electric path by Joule heat in the same manner as used in the conventional nonvolatile memory elements. Thereby, a nonvolatile memory element suitable for micro-fabrication can be provided.

Furthermore, the variable resistance layer has a multiple-layered structure. Thereby, it is possible to restrict a location where oxidation-reduction reaction progresses, only to an interface between the first metal oxide layer and the second metal oxide layer. As a result, stable variable resistance operation can be achieved.

Furthermore, the first metal oxide and the second metal oxide are oxides of the same metal element. Therefore, the variable resistance layer made of two elements, which makes it easier to manufacture the nonvolatile memory element than that including the variable resistance layer made of three elements.

It is also possible in the nonvolatile memory element that the combination ($MO_x$, $MO_y$) of $MO_x$ and $MO_y$ is selected from a group including ($VO_2$, $V_2O_5$), ($Cr_2O_3$, $CrO_3$), ($SnO$, $SnO_2$), ($Co_3O_4$, $Co_2O_3$), ($W_3O_8$, $WO_3$), and ($Cu_2O$, $CuO$).

Particularly, each of V, Cr, Sn, Co, W, and Cu in the group has energy of oxidation-reduction reaction smaller than that of the other metal elements described earlier. Therefore, when the metal oxide belonging to the group is used in the variable resistance layer, programming can be performed with a lower voltage. As a result, it is expected to achieve much more reduction in power consumption of the nonvolatile memory element.

It is further possible in the nonvolatile memory element that the combination ($MO_x$, $MO_y$) of $MO_x$ and $MO_y$ is selected from a group including ($NbO_2$, $Nb_2O_5$), ($Cr_2O_3$, $CrO_3$), ($Mn_3O_4$, $Mn_2O_3$), ($VO_2$, $V_2O_5$), ($Cu_2O$, $CuO$), ($SnO$, $SnO_2$), and ($Ti_2O_3$, $TiO_2$).

Each of Nb, Cr, Mn, V, Cu, Sn, and Ti in the group can obtain a plurality of valences with stability. Therefore, if the metal oxide belonging to the group is used in the variable resistance layer, it is possible to simplify control of an oxidation degree of each of the first metal oxide and the second metal oxide in manufacturing the nonvolatile memory element. In addition, in operating the nonvolatile memory element, it is possible to achieve stability of the operation. The metal oxides belonging to the group are available as powder in the market. Use of the materials available in the market allows the nonvolatile memory element to be manufactured easily.

It is still further possible in the nonvolatile memory element that the combination ($MO_x$, $MO_y$) of $MO_x$ and $MO_y$ is selected from a group including ($W_3O_8$, $WO_3$), ($Cu_2O$, $CuO$), ($Ti_2O_3$, $TiO_2$), and ($Co_3O_4$, $Co_2O_3$).

Each of oxides W, Cu, Ti, and Co in the group is used in existing semiconductor processes. Therefore, if the metal oxide belonging to the group is used in the variable resistance layer, it is possible to provide the nonvolatile memory element having high affinity with the semiconductor processes.

It is still further possible in the nonvolatile memory element that the combination ($MO_x$, $MO_y$) of $MO_x$ and $MO_y$ is selected from a group including ($Cu_2O$, $CuO$), ($SnO$, $SnO_2$), and ($Ti_2O_3$, $TiO_2$).

Each of Cu, Sn, and Ti in the group has a higher existence rate in the earth's crust more than that of the above-described Ce, W, and the like, and are not expensive. Therefore, a manufacturing cost can be reduced.

It is still further possible in the nonvolatile memory element that the combination ($MO_x$, $MO_y$) of $MO_x$ and $MO_y$ is ($Ce_2O_3$, $CeO_2$).

The variable resistance operation is a phenomenon with movement of oxygen. It is reported that $CeO_2$ is electrolyte having oxygen ions as conductive species. Therefore, oxygen ions can easily is move in $CeO_2$. If a Ce oxide is used in the variable resistance layer, the variable resistance operation can be performed at a high speed.

In accordance with another aspect of the present invention, there is provided a nonvolatile memory element including: a substrate; a lower electrode layer formed on the substrate; a variable resistance layer formed on the lower electrode layer, the variable resistance layer changing between a high resistance state and a low resistance state depending on applied electric signals; an upper electrode layer formed on the variable resistance layer, wherein the variable resistance layer has a multiple-layered structure including at least two layers of: a first metal oxide layer including an oxide of a first metal element $M_1$; and a second metal oxide layer including an oxide of a second metal element $M_2$ different from the first metal element $M_1$, the second metal oxide layer contacts at least one of the upper electrode layer and the lower electrode layer, and an absolute value of reaction energy of chemical reaction related to the oxide of the first metal element $M_1$ and the oxide of the second metal element $M_2$ is equal to or less than 2 eV.

The chemical reaction is expressed by a formula 2:
[Mathematical Expression 2]

$$M_1O_\alpha + M_2O_\delta \Leftrightarrow M_1O_\beta + M_2O_\gamma \qquad \text{(Formula 2)}$$

wherein $\alpha$, $\beta$, $\gamma$, and $\delta$ represent arbitrary positive numbers satisfying $\beta > \alpha$, $\delta > \gamma$, $M_1O_\alpha$ and $M_1O_\beta$ represent compositions of oxides of the first metal element $M_1$ which have different oxidation degrees, and $M_2O_\delta$ and $M_2O_\gamma$ represent compositions of oxides of the second metal element $M_2$ which have different oxidation degrees, and a combination ($M_1O_\alpha$, $M_1O_\beta$) of $M_1O_\alpha$ and $M_1O_\beta$ is ($TaO_2$, $Ta_2O_5$), and a combination ($M_2O_\delta$, $M_2O_\gamma$) of $M_2O_\gamma$ and $M_2O_\delta$ is selected from a group including ($SnO$, $SnO_2$), ($NbO_2$, $Nb_2O_5$), ($W_3O_8$, $WO_3$), and ($Ti_2O_3$, $TiO_2$).

Thereby, it is possible to suppress the applied voltage to be 2 V or less in variable resistance operations. As a result, the variable resistance operations can be performed with a low voltage. In addition, the suppression of the applied voltage up to be 2 V or less makes it possible to combine the nonvolatile memory element with an existing MOS transistor which are also used with peripheral circuits, so as to perform variable resistance operations.

Moreover, the variable resistance operation is performed using reversible oxidation-reduction reaction. It is therefore not necessary to recover a filamentary electric path by Joule heat in the same manner as used in the conventional nonvolatile memory elements. Thereby, a nonvolatile memory element suitable for micro-fabrication can be provided.

Furthermore, the variable resistance layer has a multiple-layered structure. Thereby, it is possible to restrict a location where oxidation-reduction reaction progresses, only to an interface between the first metal oxide layer and the second metal oxide layer. As a result, stable variable resistance operation can be achieved.

Furthermore, a resistance value of the nonvolatile memory element according to the present invention depends much on a band gap of the second metal oxide layer. Therefore, regardless of kinds of the first metal element $M_1$, it is possible to control the resistance value of the nonvolatile memory element based on the band gap of the oxide of the second metal element $M_2$.

It is also possible in the nonvolatile memory element that the combination ($M_2$, $O_\delta$, $M_2O_{65}$) of $M_2O_\delta$ and $M_2O_\gamma$ is selected from a group including ($SnO$, $SnO_2$), ($W_3O_8$, $WO_3$), and ($Cu_2O$, $CuO$).

Particularly, each of Sn, W, and Cu in the group has energy of oxidation-reduction reaction smaller than that of the other metal elements described earlier. Therefore, when the metal oxide belonging to the group is used in the variable resistance layer, programming can be performed with a lower voltage. As a result, it is expected to achieve much more reduction in power consumption of the nonvolatile memory element.

It is further possible in the nonvolatile memory element that the combination ($M_2$, $O_\gamma$, $M_2O_\gamma$) of $M_2O_\delta$ and $M_2O_\gamma$ is selected from a group including ($NbO_2$, $Nb_2O_5$), ($SnO$, $SnO_2$), and ($Ti_2O_3$, $TiO_2$).

Each of oxides Nb, Sn, and Ti in the group can obtain a plurality of valences with stability. Therefore, if the metal oxide belonging to the group is used in the variable resistance layer, it is possible to simplify control of an oxidation degree of each of the first metal oxide and the second metal oxide in manufacturing the nonvolatile memory element. In addition, in operating the nonvolatile memory element, it is possible to achieve stability of the operation. The metal oxides belonging to the group are available as powder in the market. Use of the materials available in the market allows the nonvolatile memory element to be manufactured easily.

It is still further possible in the nonvolatile memory element that the combination ($M_2O_\delta$, $M_2O_\gamma$) of $M_2O_\delta$ and $M_2O_\gamma$ is selected from a group including ($W_3O_8$, $WO_3$) and ($Ti_2O_3$, $TiO_2$).

Each of oxides W and Ti in the group is used in existing semiconductor processes. The metal oxides belonging to the group are available as powder in the market. Use of the materials available in the market allows the nonvolatile memory element to be manufactured easily.

It is still further possible in the nonvolatile memory element that the combination ($M_2O_{67}$, $M_2O_\gamma$) of $M_2O_\delta$ and $M_2O_\gamma$ is selected from a group including ($Cu_2O$, $CuO$), ($SnO$, $SnO_2$), and ($Ti_2O_3$, $TiO_2$).

Each of Cu, Sn, and Ti in the group has a higher existence rate in the earth's crust more than that of Ce, W, and the like, and are not expensive. Therefore, a manufacturing cost can be reduced.

Effects of the Invention

According to the present invention, it is possible to manufacture a nonvolatile memory element that does not need to generate Joule heat in variable resistance operations. As a result, it is possible to provide the resistance-variable nonvolatile memory element that is suitable to be micro-fabricated. In addition, if variable resistance material governed by chemical reaction according to the present invention is used, the nonvolatile memory element can be changed reversibly between a high resistance state and a low resistance state by using low voltages. As a result, it is possible to provide resistance-variable nonvolatile memory elements that can operate by being combined with an existing MOS transistor that can be also used by peripheral circuits.

BRIEF DESCRIPTION OF DRAWINGS

FIG. 1 is a cross-sectional view showing an example of a structure of a nonvolatile memory element according to a first embodiment of the present invention.

FIG. 7 is a cross-sectional view showing another example of the structure of the nonvolatile memory element according to the first embodiment of the present invention.

FIGS. 8A to 8E are views showing a method of manufacturing the nonvolatile memory element according to the first embodiment of the present invention.

DETAILED DISCRIPTION OF THE INVENTION

Figure 2A:
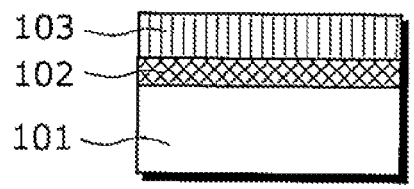
FIGS. 2A to 2E are views showing a method of manufacturing the nonvolatile memory element according to the first embodiment of the present invention.

The following describes the embodiments according to the present invention with reference to the drawings. In the drawings, like reference numbers represent identical or like parts of the embodiments of the present invention and explanation of the parts once given is sometimes not repeated.

(First Embodiment)

[Structure of Nonvolatile Memory Element]

FIG. 1 is a cross-sectional view showing an example of a structure of a nonvolatile memory element in a state (initial state) prior to start of variable resistance operations, according to a first embodiment of the present invention.

As shown in FIG. 1, the nonvolatile memory element 100 includes: a substrate 101; an oxide layer 102 formed on the substrate 101; a lower electrode layer 103 formed on the oxide layer 102; a first metal oxide layer 104 formed on the lower electrode layer 103; a second metal oxide layer 105 formed on the first metal oxide layer 104; and an upper electrode layer 106 formed on the second metal oxide layer 105. A set of the first metal oxide layer 104 and the second metal oxide layer 105 forms a variable resistance layer 107 in the nonvolatile memory element 100.

Here, the first metal oxide layer 104 includes a first metal oxide having a first resistivity, and the second metal oxide layer 105 includes a second resistivity.

[Method of Manufacturing Nonvolatile Memory Element]

Next, a method of manufacturing the nonvolatile memory element 100 shown in FIG. 1 is described with reference to FIGS. 2A to 2E.

First, as shown in FIG. 2A, a silicon dioxide film is formed as the oxide layer 102 on the substrate 101 made of single crystal silicon by using Chemical Vapor Deposition (CVD) method. Then, the lower electrode layer 103 is formed by sputtering method.

Figure 2B:
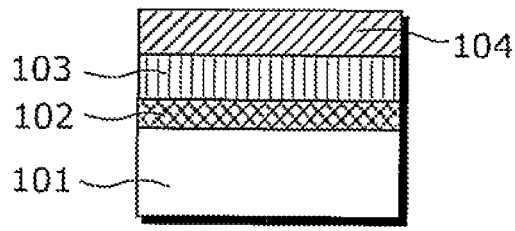

Then, as shown in FIG. 2B, the first metal oxide layer 104 is formed on the lower electrode layer 103 using a metal target, by a reactive sputtering method in which argon gas and oxygen gas are used as sputtering gas.

Figure 2C:
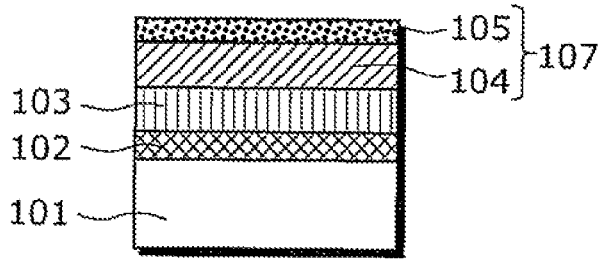

Then, as shown in FIG. 2C, the second metal oxide layer 105 is formed on the first metal oxide layer 104. In order to form the second metal oxide layer 105, it is possible to employ a reactive sputtering method using a metal target, by which argon gas and oxygen gas are used as sputtering gas, or to employ a sputtering method using a metal oxide as a target.

Figure 2D:
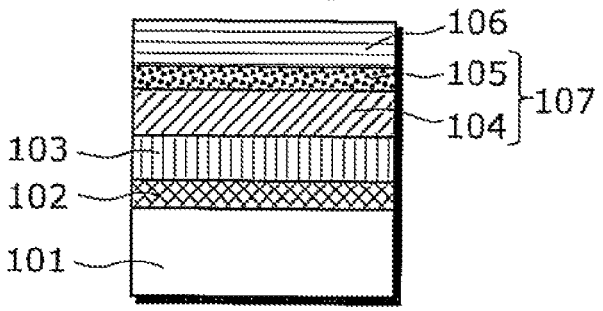

Then, as shown in FIG. 2D, the upper electrode layer 106 is formed on the second metal oxide layer 105 by a sputtering method. The lower electrode layer 103 and the upper electrode layer 106 are made of, for example, tantalum nitride (TaN), titanium nitride (TiN), platinum (Pt), iridium (Ir), copper (Cu), nickel (Ni), tungsten (W), and the like.

Figure 2E:
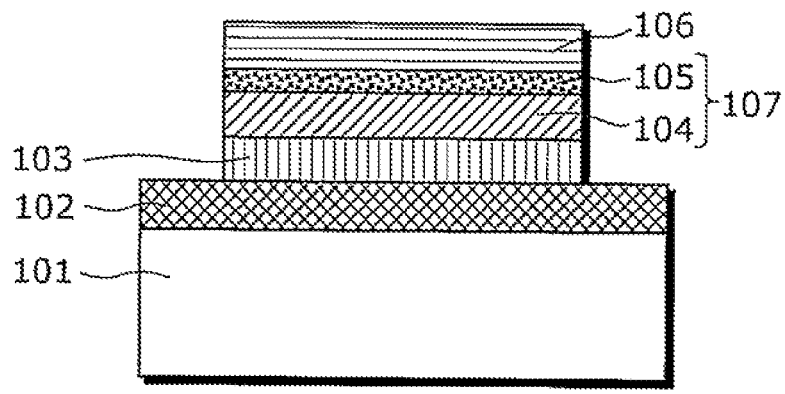

Finally, as shown in FIG. 2E, pattern is formed for the lower electrode layer 103, the variable resistance layer 107, and the upper electrode layer 106 by photolithography, and a shape is formed by dry-etching. As a result, dimensions of the set of the lower electrode layer 103, the variable resistance layer 107, and the upper electrode layer 106 is in a range from 0.5 µm to 10 µm.

[Operation Example of Nonvolatile Memory Element]

The following describes examples of operations performed by the nonvolatile memory element 100 according to the first embodiment serving as a memory, namely, operation examples of writing/reading of data, with reference to the figures.

Figure 3:
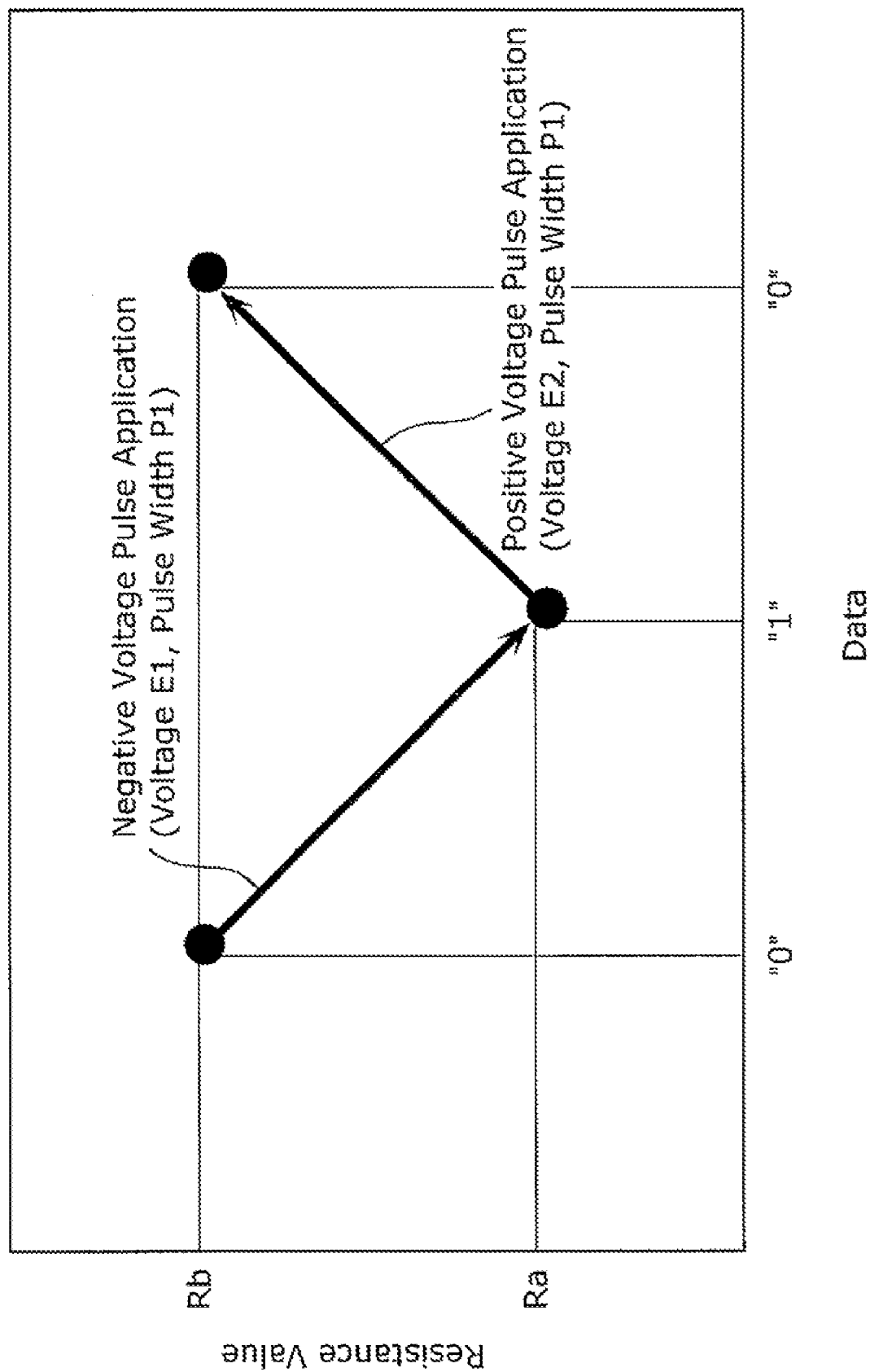
FIG. 3 is a graph plotting an example of an operation of writing data to the nonvolatile memory element according to the first embodiment of the present invention.

FIG. 3 is a graph plotting an example of an operation of writing data to the nonvolatile memory element according to the first embodiment of the present invention.

When two kinds of electric pulses having different polarities and the same pulse width P1 are alternately applied between the lower electrode layer 103 and the upper electrode layer 106, a resistance value of the variable resistance layer 107 is changed as shown in FIG. 2. More specifically, when a negative voltage pulse (voltage E1, pulse width P1) is applied between the electrode layers, the resistance value of the variable resistance layer 107 is decreased from a high resistance value Rb to a low resistance value Ra. On the other hand, when a positive voltage pulse (voltage E2, pulse width P1) is applied between the electrode layers, the resistance value of the variable resistance layer 107 is increased from the low resistance value Ra to the high resistance value Rb.

In the example shown in FIG. 3, the high resistance value Rb corresponds to data "0" and the low resistance value Ra corresponds to data "1". Therefore, when the positive voltage pulse is applied between the electrode layers to cause the resistance value of the variable resistance layer 107 to be the high resistance value Rb, data "0" is written. On the other hand, when the negative voltage pulse is applied between the electrode layers to cause the resistance value to be the low resistance value Ra, data "1" is written.

Here, an absolute value of each of the negative voltage pulse E1 and the positive voltage pulse E2 is 2 V or less.

Figure 4:
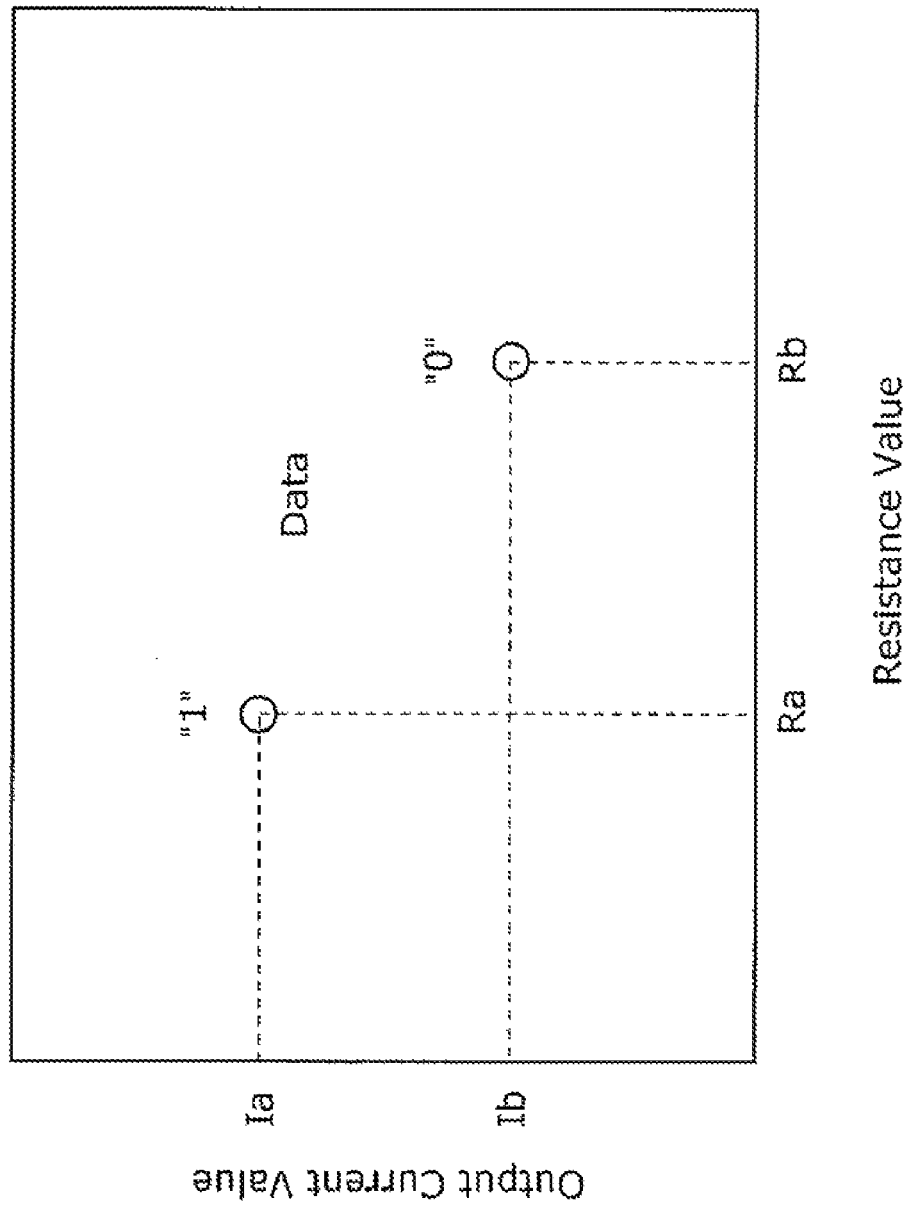
FIG. 4 is a graph plotting an example of an operation of reading out data from the nonvolatile memory element according to the first embodiment of the present invention.

FIG. 4 is a graph plotting an example of an operation of reading out data from the nonvolatile memory element.

When data is read out, a read voltage E3 is applied between the electrode layers. The read voltage E3 ($|E3|<|E1|$, $|E3|<|E2|$) has an amplitude smaller than that of an electric pulse applied to change the resistance value of the variable resistance layer 107. As a result, current depending on the resistance value of the variable resistance layer 107 flows in the variable resistance layer 107. By detecting a value of the output current, it is possible to read out data written in the variable resistance layer 107.

In the example shown in FIG. 4, an output current value Ia corresponds to the resistance value Ra, and an output current value Ib corresponds to the resistance value Rb. Therefore, detection of the output current value Ia means that data "1" is read out, and detection of the output current value Ib means that data "0" is read out.

As described above, in the region between the lower electrode layer 103 and the upper electrode layer 106, the variable resistance layer 107 serves as a memory unit. Thereby, the nonvolatile memory element 100 can operate as a memory.

[Work of Variable Resistance Layer Given by Voltage Application]

Next, work of the variable resistance layer given by an applied voltage is described. A work W of the variable resistance layer given by voltage application is expressed by the following formula 3, where n denotes the number of electrons and E denotes a voltage applied to the variable resistance layer.

[Mathematical Expression 3]

$$W = -nFE \quad \text{(Formula 3)}$$

where F denotes a Faraday constant. More specifically, if a voltage applied to the variable resistance element is 2V, a work given to the variable resistance element is 2 eV when n is 1.

A reaction formula of reaction related to the first metal oxide, the second metal oxide, oxygen ions, and electrons is expressed by the following formula 4, where $MO_x$ denotes a composition of the first metal oxide and $MO_y$ denotes a composition of the second metal oxide.

[Mathematical Expression 4]

$$MO_x + (y-x)O^{2-} \Leftrightarrow MO_y + 2(y-x)e^{-} \quad \text{(Formula 4)}$$

The reaction energy expressed by the formula 3 is assumed to be $\Delta G_{M,(y-x)}$. The reaction energy $\Delta G_{M,(y-x)}$ refers to energy required to change the oxidation number from x to y regarding the oxides $MO_x$ and $MO_y$ of metal element M.

Absolute values of reaction energy ΔG of respective chemical elements are shown in Table 1.

TABLE 1

| Metal Element M | ΔG |
| --- | --- |
| Cu | 0.08 |
| W | 0.28 |
| Co | 0.21 |
| Sn | 0.78 |
| Cr | 1.91 |
| V | 0.64 |
| Nb | 0.77 |
| Ti | 1.04 |
| Ce | 1.36 |
| Mn | 0.63 |

As shown in Table 1, each of the absolute values of reaction energy of the chemical elements is 2 eV or less.

When Em denotes a minimum voltage required to reversibly progress the reaction expressed by the formula 4, a work Wm given to the variable resistance layer by application of the voltage Em should be equal to the reaction energy ΔG. Here, the number of electrons related to the reaction is determined as 2(y−x) by the formula 4. Therefore, a relationship between $\Delta G_{M,(y-x)}$ and Em is expressed by the following formula 5 using a Faraday constant F.

[Mathematical Expression 5]

$$\Delta G_{M,(y-x)} = -2(y-x)FEm \quad \text{(Formula 5)}$$

[Reaction Energy of Oxidation-Reduction Reaction]

Figure 5:
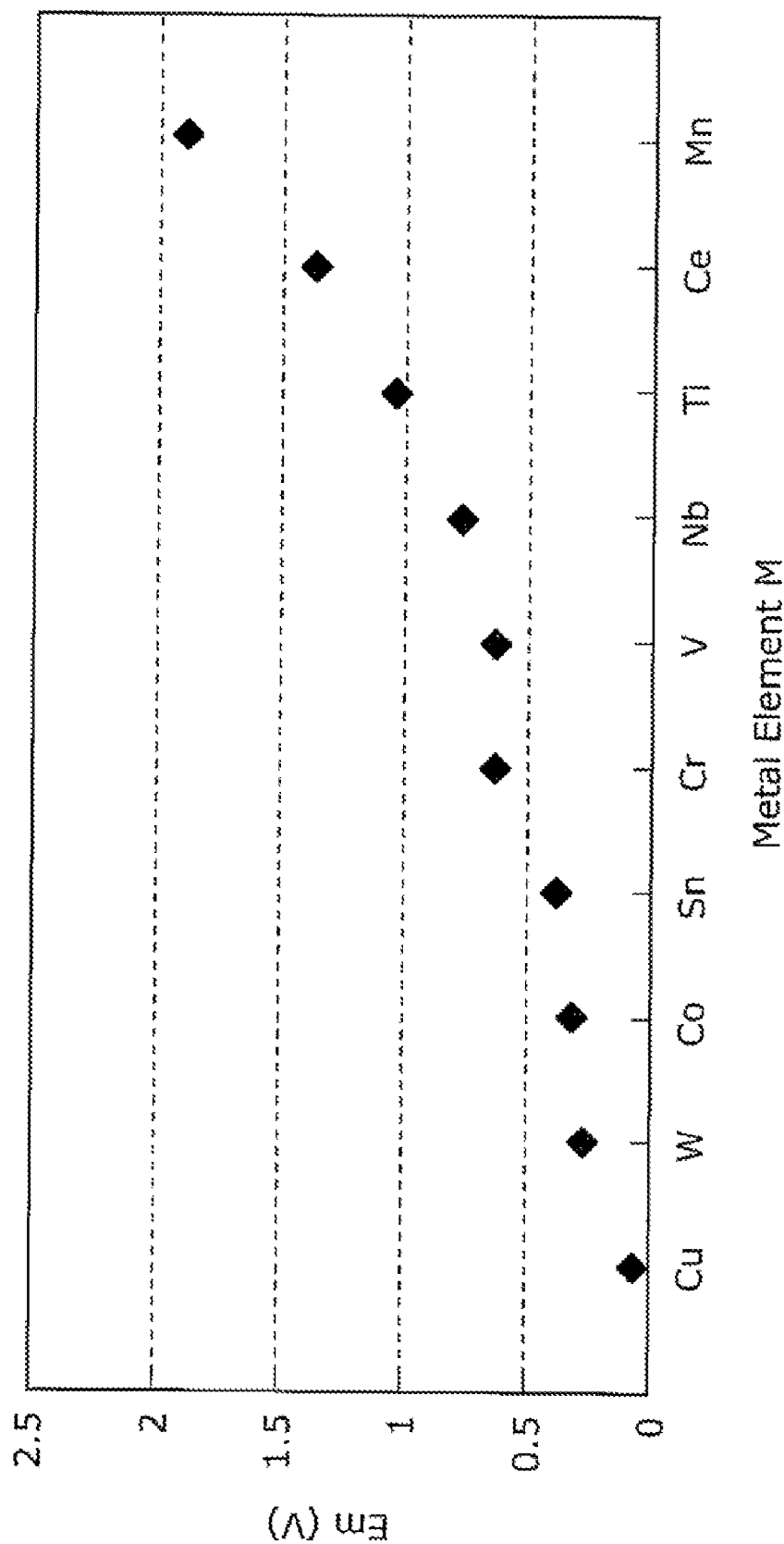
FIG. 5 is a graph plotting a minimum voltage value (Em) required for reversible variable resistance operation for each of metal oxides shown in Table 2, when the metal oxides are used as variable resistance materials.

FIG. 5 shows absolute values of Em calculated from the reaction energy $\Delta G_{M,(y-x)}$ expressed by the formula 3 regarding oxides of metal element M. The oxides of metal element M used in the example are chromium (Cr), cobalt (Co), manganese (Mn), vanadium (V), cerium (Ce), tungsten (W), copper (Cu), tin (Sn), niobium (Nb), and titanium (Ti) oxides. Table 2 shows combinations of oxides $MO_x$ and oxides $MO_y$ used to derive the absolute values of EM in FIG. 5.

TABLE 2

| Metal Element M | $MO_x$ | $MO_y$ |
| --- | --- | --- |
| Cr | $Cr_2O_3$ | $CrO_3$ |
| Co | $Co_3O_4$ | $Co_2O_3$ |
| Mn | $Mn_3O_4$ | $Mn_2O_3$ |
| V | $VO_2$ | $V_2O_5$ |
| Ce | $Ce_2O_3$ | $CeO_2$ |
| W | $W_3O_8$ | $WO_3$ |

TABLE 2-continued

| Metal Element M | $MO_x$ | $MO_y$ |
| --- | --- | --- |
| Cu | $Cu_2O$ | $CuO$ |
| Sn | $SnO$ | $SnO_2$ |
| Nb | $NbO_2$ | $Nb_2O_5$ |
| Ti | $Ti_2O_3$ | $TiO_2$ |

Here, the resistivity of the first metal oxide $MO_x$ is lower than the resistivity of the second metal oxide $MO_y$. As shown in FIG. 5, every Em is 2 V or less. Therefore, it is expected that voltages of 2 V or less applied to the oxides cause resistance change phenomenon. As a result, it is learned that, if an absolute value of reaction energy of each chemical element is 2 eV or less, an absolute value of Em is 2 V or less.

The following explains derivation of the reaction energy ΔG.

The derivation of a value of the reaction energy ΔG is performed by using VASP code (disclosed in Non-Patent Reference: Phys. Rev. B 47, 558 (1993), Comput. Mat. Sci 6, 15 (1996), Phys. Rev. B 54, 11 169 (1996)) employing first-principles calculation. The above calculation can obtain reaction enthalpy of the reaction expressed by the formula 4. The temperature used for the nonvolatile memory element according to the first embodiment is assumed to be 85° C. or lower, by which a ratio of the reaction enthalpy to the reaction energy ΔG is small enough. Therefore, reaction enthalpy calculated by the calculation is assumed to be equal to the reaction energy ΔG.

As shown in FIG. 5, for every combination of the first metal oxide $MO_x$ and the second metal oxide $MO_y$ shown in FIG. 2, an absolute value of Em is 2 V or less. Therefore, in the nonvolatile memory element 100 using oxidation-reduction reaction of the first metal oxide $MO_x$ and the second metal oxide $MO_y$ shown in Table 2, variable resistance operations can be performed by applying voltages of 2 V or less.

[High Resistance State and Low Resistance State]

Next, steps in the variable resistance operation using oxidation-reduction reaction are schematically explained with reference to FIGS. 6A to 6C.

Figure 6A:
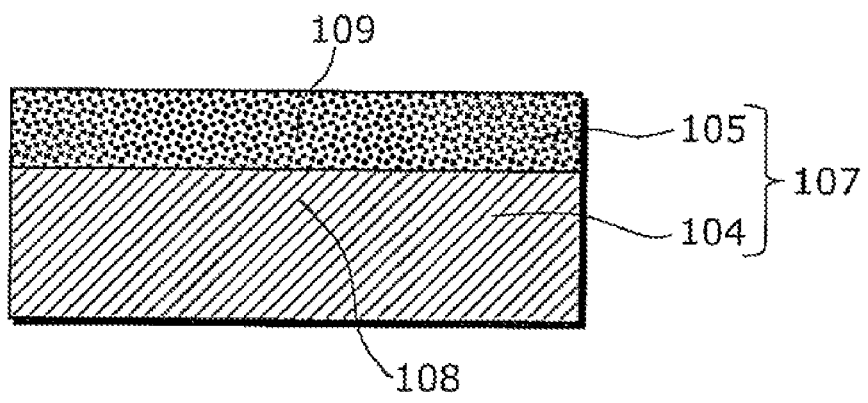
FIGS. 6A to 6C are views for explaining steps of variable resistance operation of a variable resistance layer in the nonvolatile memory element according to the first embodiment of the present invention.

FIG. 6A is a view schematically showing a state (initial state) of the variable resistance layer 107 according to the first embodiment prior to start of the variable resistance operation. In the initial state shown in FIG. 6A, the first metal oxide layer 104 includes the first metal oxide 108 having a compound represented by $MO_x$, and the second metal oxide layer 105 includes the second metal oxide 109 having a compound represented by $MO_y$. Here, the first metal oxide 108 is one of the oxides represented by $MO_x$ in Table 2, and the second metal oxide 109 is one of the oxides represented by $MO_y$ in Table 2.

By applying a voltage (negative voltage) causing the upper electrode layer to be negative to the variable resistance layer 107 shown in FIG. 6A with reference to the lower electrode layer, oxygen ions of the second metal oxide layer 105 is moved to the first metal oxide layer 104. Since the oxygen ions are moved, the second metal oxide 109 is reduced, thereby oxidizing the first metal oxide 108. Thereby, as shown in FIG. 6B, a reactive layer 110 is formed at an interface between the second metal oxide layer 105 and the first metal oxide layer 104.

By forming the reactive layer 110, a ratio of the second metal oxide 109 having high resistance to the variable resistance layer 107 is reduced. As a result, the variable resistance layer 107 is changed to a low resistance state.

From the above-described application of the negative voltage, it is expected that the reactive layer 110 includes the first metal oxide 108 more than the second metal oxide 109. However, since the second metal oxide 109 is not uniformly formed in the reactive layer 110, leak current is likely to flow in the reactive layer 110 more than in the second metal oxide 109. Therefore, a resistivity of the reactive layer 110 is lower than that of the second metal oxide layer 105.

Figure 6B:
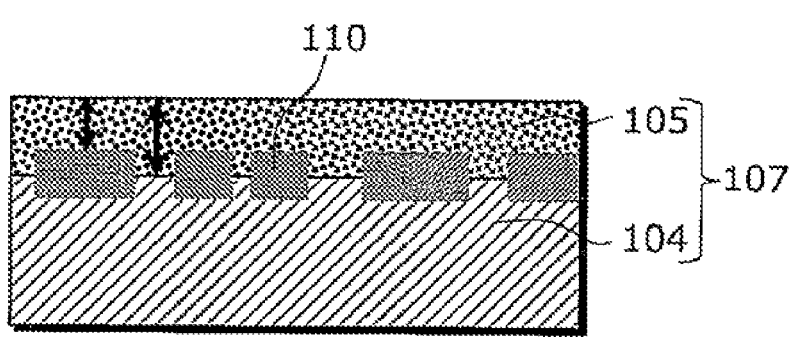
Figure 6C:
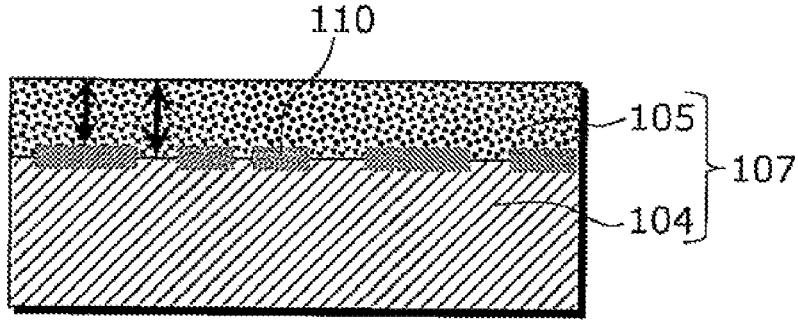

Next, a voltage (positive voltage) causing the upper electrode layer to be positive is applied to the variable resistance layer in a low resistance state shown in FIG. 6B with reference to the lower electrode layer. Thereby, the variable resistance layer is changed to the high resistance state shown in FIG. 6C. The application of the positive voltage moves oxygen ions to the second metal oxide layer 105. Thereby, the second metal oxide 109 having high resistance is formed by oxidation reaction. As a result, a ratio of the second metal oxide 109 having high resistance to the variable resistance layer 107 is increased more than that in the case of the low resistance state. This means that the variable resistance layer is changed to a high resistance state. Since the reactive layer 110 is included in the variable resistance layer 107 in the high resistance state shown in FIG. 6C, a resistance value of the variable resistance layer 107 in the high resistance state shown in FIG. 6C is higher than that in the initial state shown in FIG. 6A.

As described above, if the variable resistance layer 107 has a multiple-layered structure including the second metal oxide layer 105 and the first metal oxide layer 104, it is possible to restrict a location where oxidation-reduction reaction occurs, only to the interface between the second metal oxide layer and the first metal oxide layer. As a result, stable variable resistance operation can be achieved.

It has been described in the above description that oxides Cr, Co, Mn, V, Ce, W, Cu, Sn, Nb, and Ti are preferable for the first metal oxide 108 and the second metal oxide 109. In the below description, however, the metal oxides used as the first metal oxide 108 and the second metal oxide 109 are more limited so as to offer additional effects.

For example, the metal oxide can be selected from a group of oxides V, Cr, Sn, Co, W, and Cu. Especially, the metal elements in the group have oxidation-reduction reaction energy smaller than that of other metal oxides described earlier. Therefore, if the metal oxide belonging to the group is used in the variable resistance layer 107, programming can be performed by a lower voltage. As a result, it is expected to achieve much more reduction in power consumption of the nonvolatile memory element 100.

It is also possible to select the metal oxide from a group of oxides Nb, Cr, Mn, V, Cu, Sn, and Ti, for example. The metal elements in the group can obtain a plurality of valences with stability. Therefore, if the metal oxide belonging to the group is used in the variable resistance layer 107, it is possible to simplify control of an oxidation degree of each of the first metal oxide 108 and the second metal oxide 109 in manufacturing the nonvolatile memory element 100. In addition, in operating the nonvolatile memory element 100, it is possible to achieve stability of the operation. The metal oxides belonging to the group are available as powder in the market. Use of the materials available in the market allows the nonvolatile memory element 100 to be manufactured easily.

It is further possible to select the metal oxide from a group of oxides W, Cu, Ti, and Co, for example. The metal elements in the group are used in existing semiconductor processes. Therefore, if the metal oxide belonging to the group is used in the variable resistance layer 107, it is possible to provide the nonvolatile memory element 100 having high affinity with the semiconductor processes.

It is still further possible to select the metal oxide from a group of oxides Cu, Sn, and Ti. The metal elements in the group have a higher existence rate in the earth's crust more than that of Ce, W, and the like, and are not expensive. Therefore, a manufacturing cost can be reduced.

It is still further possible that the metal oxide is $CeO_2$, for example. It is reported that $CeO_2$ is electrolyte transporting oxygen ions as conductive species. Therefore, oxygen ions can easily move in $CeO_2$. If an Ce oxide is used in the variable resistance layer 107, the variable resistance operation can be performed at a high speed.

[Multiple-Layered Structure Including Different Metal Oxide Layers]

The above description is given for the nonvolatile memory element including the variable resistance layer in which the second metal oxide layer 105 and the first metal oxide layer 104 include the oxide of the same metal element. The nonvolatile memory element according to the first embodiment performs the variable resistance operations by oxidation-reduction reaction. Therefore, in principle, the second metal oxide 109 and the first metal oxide 108 shown in FIGS. 6A to 6C may include oxides of different metal elements.

A chemical reaction formula related to $M_1O_\alpha$, $M_2O_\delta$, $M_1O_\beta$, and $M_2O_\gamma$ is presented as the following formula 6, where $\alpha$, $\beta$, $\delta$, and $\gamma$ are arbitrary positive numbers to satisfy $\beta>\alpha$, $\delta>\gamma$, $M_1O_\alpha$ and $M_1O_\beta$ are compositions of oxides of first metal element $M_1$ which have different oxidation degrees, and $M_2O_\delta$ and $M_2O_\gamma$ are compositions of oxides of the second metal element $M_2$ which have different oxidation degrees.

[Mathematical Expression 6]

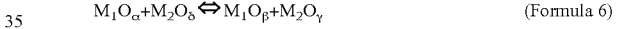

$$M_1O_\alpha + M_2O_\delta \Leftrightarrow M_1O_\beta + M_2O_\gamma \quad \text{(Formula 6)}$$

When the reaction energy of the reaction expressed by the formula 6 is 2 eV or less, the variable resistance operation can be performed by applying voltages of 2 V or less.

[Structure of Variable Resistance Layer Including Different Metal Oxide Layers]

Next, the description is given for a structure of the nonvolatile memory element in an initial state with reference to FIG. 7. The nonvolatile memory element in the initial state includes a resistance change layer including (a) an oxide of a first metal element $M_1$ and (b) an oxide of a second metal element $M_2$.

As shown in FIG. 7, the nonvolatile memory element 200 includes: a substrate 112; an oxide layer 113 formed on the substrate 112; a lower electrode layer 114 formed on the oxide layer 113; a first metal oxide layer 115 formed on the lower electrode layer 114; a second metal oxide layer 116 formed on the first metal oxide layer 115; and an upper electrode layer 117 formed on the second metal oxide layer 116. A variable resistance layer 118 in the nonvolatile memory element 200 comprises the first metal oxide layer 115 and the second metal oxide layer 116.

Here, the first metal oxide layer 115 includes an oxide of a first metal element $M_1$ and the second metal oxide layer 116 includes an oxide of a second metal element $M_2$.

[Method of Manufacturing Nonvolatile Memory Element]

Next, a method of manufacturing the nonvolatile memory element 200 shown in FIG. 7 is described with reference to FIGS. 8A to 8E.

First, as shown in FIG. 8A, a silicon dioxide film is formed as the oxide layer 113 on the substrate 112 made of single crystal silicon by using CVD method. Then, the lower electrode layer 114 is formed by sputtering method.

Then, as shown in FIG. 8B, the first metal oxide layer 115 is formed on the lower electrode layer 114 using a target of the first metal element $M_1$, by a reactive sputtering method in which argon gas and oxygen gas are used as sputtering gas.

Then, as shown in FIG. 8C, the second metal oxide layer 116 is formed on the first metal oxide layer 115. In order to form the second metal oxide layer 116, it is possible to employ a reactive sputtering method using a target of the second metal element $M_2$, by which argon gas and oxygen gas are used as sputtering gas, or to employ a sputtering method using a metal oxide as a target.

Then, as shown in FIG. 8D, the upper electrode layer 117 is formed on the second metal oxide layer 116 by a sputtering method. The lower electrode layer 114 and the upper electrode layer 117 are made of, for example, tantalum nitride (TaN), titanium nitride (TiN), platinum (Pt), iridium (Ir), copper (Cu), nickel (Ni), tungsten (W), or the like.

Finally, as shown in FIG. 8E, pattern is formed for the lower electrode layer 114, the variable resistance layer 118, and the upper electrode layer 117 by photolithography, and a shape is formed by dry-etching. As a result, dimensions of the set of the lower electrode layer 114, the variable resistance layer 118, and the upper electrode layer 117 is in a range from 0.5 μm to 10 μm.

[High Resistance State and Low Resistance State of Multiple-Layered Structure Including Different Metal Oxide Layers]

Next, steps in the variable resistance operation of the variable resistance layer 118 in the nonvolatile memory element 200 using oxidation-reduction reaction are schematically explained with reference to FIGS. 9A to 9C.

Figure 9A:
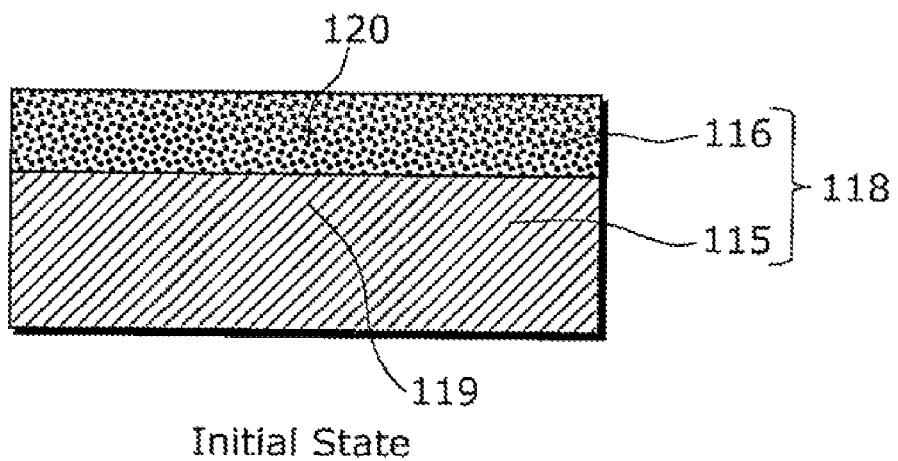
FIGS. 9A to 9C are views for explaining steps of variable resistance operation of the variable resistance layer in the nonvolatile memory element according to the first embodiment of the present invention.

FIG. 9A is a view for schematically showing a state (initial state) prior to start of a variable resistance operation of the variable resistance layer 118 according to the first embodiment of the present invention. In the initial state shown in FIG. 9A, the first metal oxide layer 115 includes the oxide 119 of the first metal element $M_1$ which has a composition represented by $M_1O_\alpha$, and the second metal oxide layer 116 includes the oxide 120 of the second metal element $M_2$ which has a composition represented by $M_2O_\delta$.

By applying a negative voltage to the variable resistance layer 118 in the state shown in FIG. 9A, oxygen ions move from the upper electrode layer 117 towards the lower electrode layer 114. Thereby, the oxide 120 of the second metal element $M_2$ is reduced, thereby oxidizing the oxide 119 of the first metal element $M_1$. As a result, a reactive layer 121 is formed at an interface between the first metal oxide layer 115 and the second metal oxide layer 116.

The reaction expressed by the formula 6 progresses in the reactive layer 121. In the reactive layer 121, an oxide of the first metal element $M_1$ and an oxide of the second metal element $M_2$ which have compositions represented by $M_1O_\alpha$, $M_1O_\beta$ ($\beta>\alpha$), $M_2O_\gamma$, $M_2O_\delta$ ($\delta>\gamma$) are mixed. The formation of the reactive layer 121 reduces a ratio of the oxide 120 of the second metal element $M_2$ having a high-resistance composition represented by $M_2O_\delta$ to the variable resistance layer 118, thereby realizing a low resistance state.

Figure 9B:
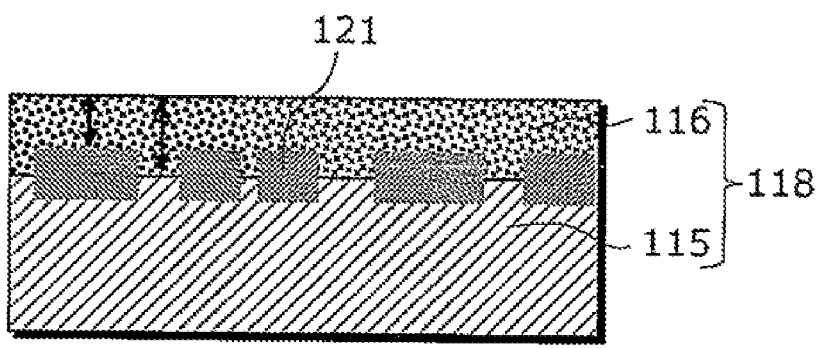
Figure 9C:
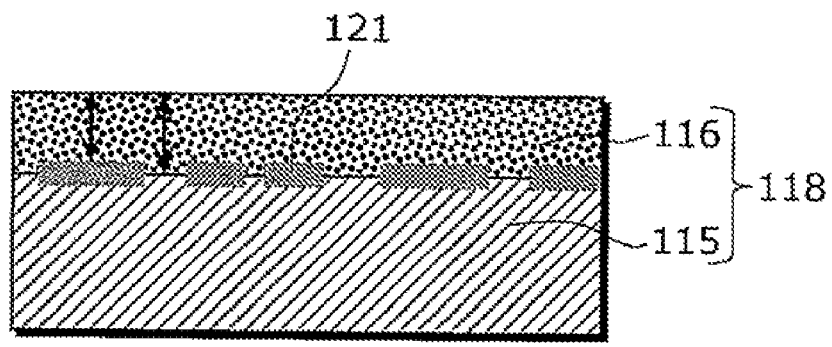

In addition, by applying a positive voltage to the variable resistance layer 118 in the low resistance state shown in FIG. 9B, the variable resistance layer 118 is changed to the high resistance state shown in FIG. 9C. The application of the positive voltage moves oxygen ions from the lower electrode layer 114 towards the upper electrode layer 117. Thereby, reverse reaction of the reaction expressed by the formula 6 progresses. As a result, as shown in FIG. 9C, a ratio of the oxide 120 of the second metal oxide $M_2$ which has a composition represented by $M_2O_\delta$ to the variable resistance layer 118 is higher than that in the low-resistance state of FIG. 9B. Thereby, the high resistance state is achieved.

As described above, if the variable resistance layer 118 has a multiple-layered structure including the second metal oxide layer 116 and the first metal oxide layer 115, it is possible to restrict a location where oxidation-reduction reaction occurs, to an interface between the second metal oxide layer 116 and the first metal oxide layer 115. As a result, a stable variable resistance operation can be achieved.

Next, the external voltage Em required to reversibly progress the reaction expressed by the formula 6 is described. The formula 6 is divided into the following formulas 7 and 8.

[Mathematical Expression 7]

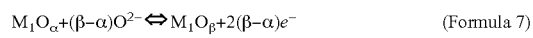

$$M_1O_\alpha + (\beta-\alpha)O^{2-} \Leftrightarrow M_1O_\beta + 2(\beta-\alpha)e^- \quad \text{(Formula 7)}$$

[Mathematical Expression 8]

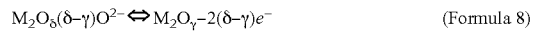

$$M_2O_\delta(\delta-\gamma)O^{2-} \Leftrightarrow M_2O_\gamma - 2(\delta-\gamma)e^- \quad \text{(Formula 8)}$$

Here, the material balance of the formula 6 establishes $(\beta-\alpha)=(\delta-\gamma)$. The formulas 7 and 8 shows that the number of electrons related to the progress of the reaction expressed by the formula 6 is $2(\beta-\alpha)$. Therefore, if the reaction energy expressed by the formula 6 is the following formula 9,

[Mathematical Expression 9]

$$\Delta G_{M1,M2,(\beta-\alpha)} \quad \text{(Formula 9)}$$

then, the following formula 10 is established.

[Mathematical Expression 10]

$$\Delta G_{M1,M2,(\beta-\alpha)} = -2(\beta-\alpha)FEm \quad \text{(Formula 10)}$$

By the formula 10, a minimum voltage value Em required for variable resistance operation is calculated from reaction energy.

Figure 10:
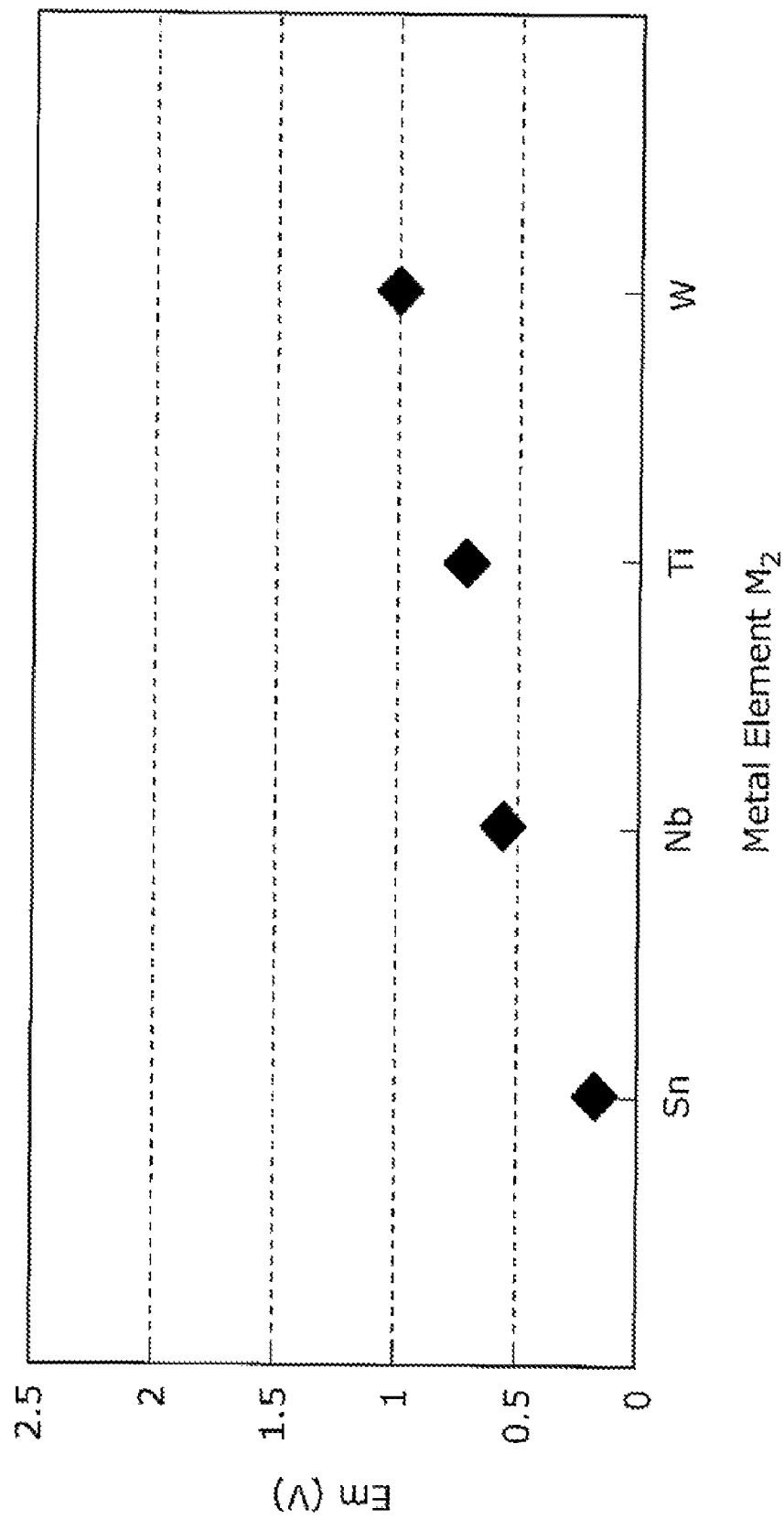
FIG. 10 is a graph plotting a minimum voltage value (Em) required for reversible variable resistance operation for each of metal oxides shown in Table 3, when the metal oxides are used as variable resistance materials.
Figure 11:
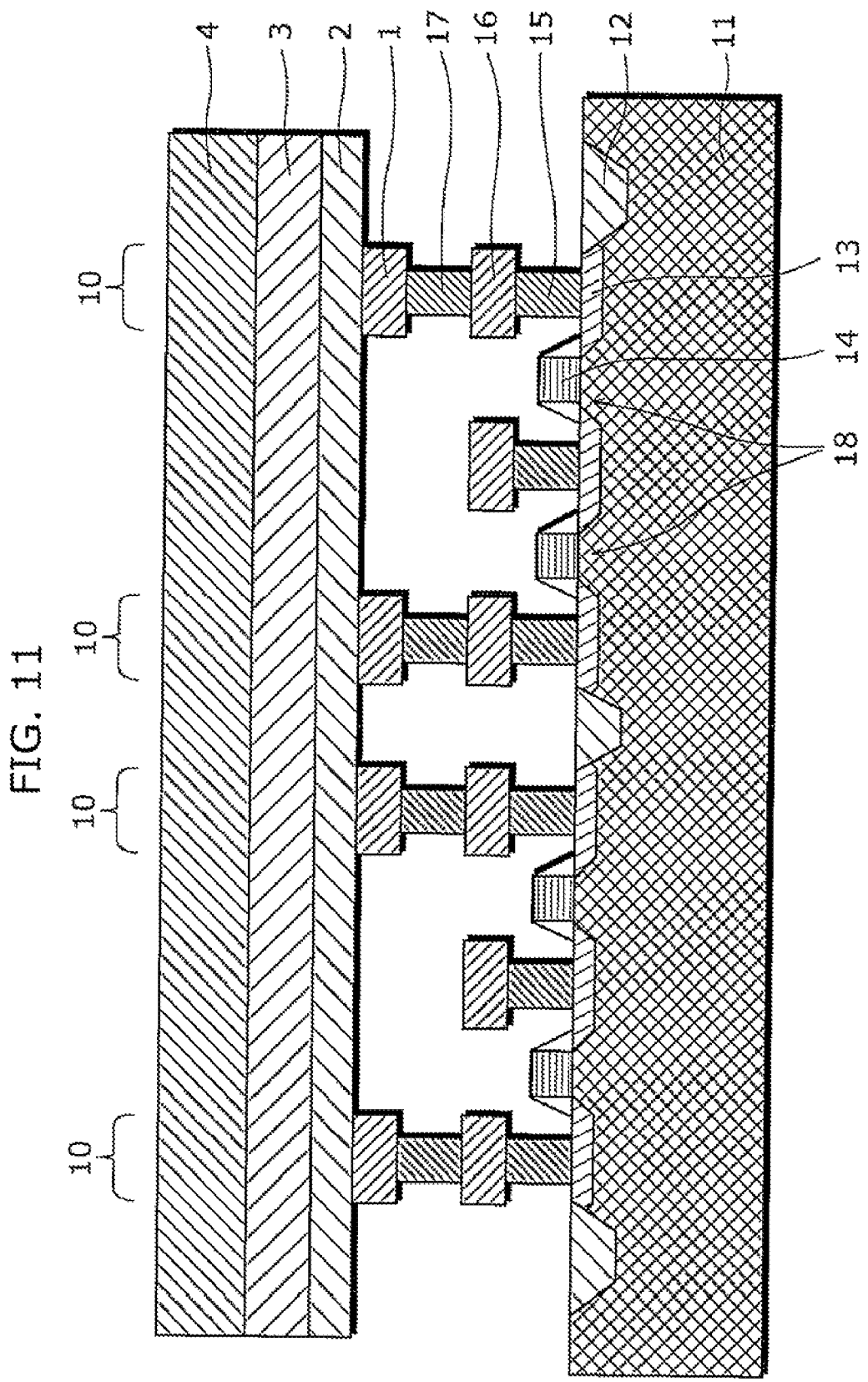
FIG. 11 is a cross-sectional view of a structure of a conventional nonvolatile memory element.

FIG. 10 is a graph plotting the minimum voltage value Em required for variable resistance operation, when $TaO_2$ is used as the oxide 119 of the first metal element $M_1$ which has a composition represented by $M_1O_\alpha$, and each of $SnO_2$, $Nb_2O_5$, $TiO_2$, and $WO_3$ is used as the oxide 120 of the second metal element $M_2$ which has a composition represented by $M_2O_\delta$. Here, $TaO_2$ represents a metallic electron state, each of $SnO_2$, $Nb_2O_5$, $Ti_2O_3$, and $WO_3$ is an insulator having a band gap, and each of $SnO_2$, $Nb_2O_5$, and $WO_3$ has a resistance value higher than $TaO_2$. Each Em shown in FIG. 10 is derived from the same method as used in FIG. 5. Table 3 shows combinations of oxides corresponding to $M_1O_\alpha$, $M_2O_\delta$, $M_1O_\beta$, and $M_2O_\gamma$ expressed by the formula 6.

TABLE 3

| Metal Element $M_2$ | $M_1O_\alpha$ | $M_1O_\beta$ | $M_2O_\delta$ | $M_2O_\gamma$ |
|---|---|---|---|---|
| Sn | $TaO_2$ | $Ta_2O_5$ | $SnO_2$ | $SnO$ |
| Nb |  |  | $Nb_2O_5$ | $NbO_2$ |
| T |  |  | $TiO_2$ | $Ti_2O_3$ |
| W |  |  | $WO_3$ | $WO_3O_8$ |

Table 4 shows reaction energy in the situation where $TaO_2$ is used as the oxide 119 of the first metal element $M_1$ which has a composition represented by $M_1O_\alpha$, and each of $SnO_2$, $Nb_2O_5$, $TiO_2$, and $WO_3$ is used as the oxide 120 of the second metal element $M_2$ which has a composition represented by $M_2O_\delta$.

TABLE 4

| Metal Element $M_2$ | $\Delta G$ |
|---|---|
| Sn | 0.35 |
| Nb | 0.56 |
| Ti | 0.73 |
| W | 1.00 |

Each absolute value of the reaction energy shown in Table 4 is 2 eV or less.

As shown in FIG. 10, when the oxide 119 of the first metal element $M_1$ and the oxide 120 of the second metal element $M_2$ are used in the combinations shown in Table 3, every Em is 2 V or less.

Therefore, a minimum voltage value required for variable resistance operation is 2 V or less.

As described above, the use of metal oxides made of different metals for the oxide 119 of the first metal element $M_1$ and the oxide 120 of the second metal element $M_2$ can control the resistance value of the variable resistance layer 118.

A band gap of the oxide of the second metal element $M_2$ represented by $M_2O_\delta$ depends much on metal species. A resistance value of the variable resistance layer 118 depends much on a band gap of the oxide of the second metal element $M_2$ represented by $M_2O_\delta$ and a work function of the upper electrode layer 117.

Band gaps of $SnO_2$, $Nb_2O_5$, $TiO_2$, and $WO_3$ are different and 3.6 eV, 3.2 eV, 3 eV, and 2.7 eV, respectively. Therefore, by selecting one from the various different oxides $M_2O_\delta$ of the second metal element $M_2$, it is possible to control the resistance value of the nonvolatile memory element 200.

More specifically, if the resistance value is to be increased, $SnO_2$ having a large band gap is used as the oxide 120 of the second metal element $M_2$ represented by $M_2O_\delta$. On the other hand, if the resistance value is to be decreased, $WO_3$ having a small band gap is used as the oxide 120.

In the above description, when an oxide Ta is used as the oxide 119 of the first metal element $M_1$, each oxide Sn, Nb, Ti, or W is preferably used as the oxide 120 of the second metal element $M_2$. The following describes additional effects produced by further limiting the metal oxides used as the oxide 120 of the second metal element $M_2$.

For example, the metal oxide can be selected from a group of oxides Sn, W, and Cu. Especially, the metal elements in the group have oxidation-reduction reaction energy smaller than that of other metal oxides described earlier. Therefore, if the metal oxide belonging to the group is used in the variable resistance layer 118, programming can be performed by a lower voltage. As a result, it is expected to achieve much more reduction in power consumption of the nonvolatile memory element 200.

It is also possible to select the metal oxide from a group of oxides Nb, Sn, and Ti, for example. The metal elements in the group can obtain a plurality of valences with stability. Therefore, if the metal oxide belonging to the group is used in the variable resistance layer 118, it is possible to simplify control of an oxidation degree of the oxide 120 of the second metal element $M_2$ in manufacturing the nonvolatile memory element 200. In addition, in operating the nonvolatile memory element 200, it is possible to achieve stability of the operation. The metal oxides belonging to the group are available as powder in the market. Use of the materials available in the market allows the nonvolatile memory element 200 to be manufactured easily.

It is further possible to select the metal oxide from a group of oxides W and Ti, for example. The metal elements in the group are used in existing semiconductor processes. Therefore, if the metal oxide belonging to the group is used in the variable resistance layer 118, it is possible to provide the nonvolatile memory element 200 having high affinity with the semiconductor processes.

It is still further possible to select the metal oxide from a group of oxides Sn and Ti. The metal elements in the group have a higher existence rate in the earth's crust more than that of Ce, W, and the like, and are not expensive. Therefore, a manufacturing cost can be reduced.

INDUSTRIAL APPLICABILITY

The nonvolatile memory element according to the present invention achieves high-speed operations and has stable writing characteristics. Therefore, the nonvolatile memory element according to the present invention is useful as a nonvolatile memory element or the like used in various electronic devices such as digital home appliances, memory cards, mobile telephones, and personal computers.

| Numerical References | |
|---|---|
| 1 | lower electrode |
| 2 | high resistance layer |
| 3 | ion source layer |
| 4 | upper electrode |
| 10 | variable resistance element |
| 11 | semiconductor substrate |
| 12 | element separating layer |
| 13 | source/drain region |
| 14 | gate electrode |
| 15 | plug layer |
| 16 | metal line layer |
| 17 | plug layer |
| 18 | MOS transistor |
| 100 | nonvolatile memory element |
| 101 | substrate |
| 102 | oxide layer |
| 103 | lower electrode layer |
| 104 | first metal oxide layer |
| 105 | second metal oxide layer |
| 106 | upper electrode layer |
| 107 | variable resistance layer |
| 108 | first metal oxide layer |
| 109 | second metal oxide layer |
| 110 | reactive layer |
| 112 | substrate |
| 113 | oxide layer |
| 114 | lower electrode layer |
| 115 | first metal oxide layer |
| 116 | second metal oxide layer |
| 117 | upper electrode layer |
| 118 | variable resistance layer |
| 119 | oxide of first metal element $M_1$ |
| 120 | oxide of second metal element $M_2$ |
| 121 | reactive layer |
| 200 | nonvolatile memory element |

The invention claimed is:

1. A nonvolatile memory element comprising:
a substrate;
a lower electrode layer formed on the substrate;
a variable resistance layer formed on the lower electrode layer, the variable resistance layer changing between a high resistance state and a low resistance state depending on applied electric signals having different polarities;
an upper electrode layer formed on the variable resistance layer,
wherein the variable resistance layer has a multiple-layered structure including at least two layers of:

a first metal oxide layer including an oxide of a first metal element $M_1$; and a second metal oxide layer including an oxide of a second metal element $M_2$ different from the first metal element $M_1$, the second metal oxide layer (i) contacts at least one of the upper electrode layer and the lower electrode layer, and (ii) contacts the first metal oxide layer, and an absolute value of reaction energy of chemical reaction related to the oxide of the first metal element $M_1$ and the oxide of the second metal element $M_2$ is equal to or less than 2 eV, the chemical reaction being expressed by a formula 12:

[Mathematical Expression 12]

$$M_1O_\alpha + M_2O_\delta \Leftrightarrow M_1O_\beta + M_2O_\gamma \quad \text{(Formula 12)}$$

wherein $\alpha$, $\beta$, $\gamma$, and $\delta$ represent arbitrary positive numbers satisfying $\beta > \alpha$, $\delta > \gamma$, $M_1O_\alpha$, and $M_1O_\beta$ represent compositions of oxides of the first metal element $M_1$ which have different oxidation degrees, and $M_2O_\delta$ and $M_2O_\gamma$ represent compositions of oxides of the second metal element $M_2$ which have different oxidation degrees, and a combination $(M_1O_\alpha, M_1O_\beta)$ of $M_1O_\alpha$ and $M_1O_\beta$ is $(TaO_2, Ta_2O_5)$, and a combination $(M_2O_\gamma, M_2O_\delta)$ of $M_2O_\delta$ and $M_2O_\gamma$ is selected from a group including $(SnO, SnO_2)$, $(NbO_2, Nb_2O_5)$, $(W_3O_8, WO_3)$, $(Cu_2O, CuO)$, and $(Ti_2O_3, TiO_2)$.

2. The nonvolatile memory element according to claim 1, wherein the combination $(M_2O_\gamma, M_2O_\delta)$ of $M_2O_\delta$ and $M_2O_\gamma$ is selected from a group including $(SnO, SnO_2)$, $(W_3O_8, WO_3)$, and $(Cu_2O, CuO)$.

3. The nonvolatile memory element according to claim 1, wherein the combination $(M_2O_\gamma, M_2O_\delta)$ of $M_2O_\delta$ and $M_2O_\gamma$ is selected from a group including $(NbO_2, Nb_2O_5)$, $(SnO, SnO_2)$, and $(Ti_2O_3, TiO_2)$.

4. The nonvolatile memory element according to claim 1, wherein the combination $(M_2O_\gamma, M_2O_\delta)$ of $M_2O_\delta$ and $M_2O_\gamma$ is selected from a group including $(W_3O_8, WO_3)$ and $(Ti_2O_3, TiO_2)$.

5. The nonvolatile memory element according to claim 1, wherein the combination $(M_2O_\gamma, M_2O_\gamma)$ of $M_2O_\delta$ and $M_2O_\gamma$ is selected from a group including $(SnO, SnO_2)$ and $(Ti_2O_3, TiO_2)$.

* * * * *